United States Patent
Blasche et al.

(10) Patent No.: US 10,324,150 B2
(45) Date of Patent: Jun. 18, 2019

(54) METHOD AND APPARATUS FOR GENERATING A MAGNETIC RESONANCE IMAGE DATA SET

(71) Applicant: Siemens Healthcare GmbH, Erlangen (DE)

(72) Inventors: Mathias Blasche, Buckenhof (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 195 days.

(21) Appl. No.: 15/454,186

(22) Filed: Mar. 9, 2017

(65) Prior Publication Data

US 2017/0261582 A1    Sep. 14, 2017

(30) Foreign Application Priority Data

Mar. 9, 2016 (DE) .................. 10 2016 203 838

(51) Int. Cl.
*G01V 3/00*    (2006.01)
*G01R 33/483*    (2006.01)
(Continued)

(52) U.S. Cl.
CPC ...... *G01R 33/4835* (2013.01); *G01R 33/5611* (2013.01); *G01R 33/56341* (2013.01); *G01R 33/583* (2013.01); *G01R 33/5615* (2013.01)

(58) Field of Classification Search
USPC ........................................... 324/309
See application file for complete search history.

(56) References Cited

U.S. PATENT DOCUMENTS

2012/0319686 A1* 12/2012 Jesmanowicz ......... A61B 5/055
                                                                      324/309
2014/0218026 A1*  8/2014 Moeller ............. G01R 33/4835
                                                                      324/309
(Continued)

FOREIGN PATENT DOCUMENTS

DE    10 2015 207 591 A1    10/2016

OTHER PUBLICATIONS

Blaimer et al: "Accelerated Volumetric MRI With a SENSE/GRAPPA Combination". Journal of Magnetic Resonance Imaging, vol. 24; pp. 444-450 (2006).
(Continued)

*Primary Examiner* — Rodney E Fuller
(74) *Attorney, Agent, or Firm* — Schiff Hardin LLP

(57) ABSTRACT

In a method and apparatus for generating a magnetic resonance (MR) image data set of a target region, MR data for a first number of slices are recorded and the recording of MR data for a second number, which is smaller than or equal to the first number, of different slices takes place simultaneously. A separation algorithm of the parallel imaging is used to determine MR data that are assigned to individual slices from the multi-slice data set produced during the simultaneous recording of the multiple slices. This separation algorithm uses input parameters determined from a calibration data set of the target region, the calibration data set being recorded in a reference scan, after which the MR image data set is reconstructed from the MR data assigned to individual slices, wherein at least part of the calibration data set is also used for reconstructing the MR image data set.

12 Claims, 1 Drawing Sheet

(51) Int. Cl.
    *G01R 33/561*     (2006.01)
    *G01R 33/58*     (2006.01)
    *G01R 33/563*     (2006.01)

(56) References Cited

U.S. PATENT DOCUMENTS

| | | | |
|---|---|---|---|
| 2015/0260820 A1 | 9/2015 | Speier | |
| 2016/0313433 A1 | 10/2016 | Beck | |
| 2017/0074960 A1* | 3/2017 | Bhat | G01R 33/5616 |
| 2017/0205486 A1* | 7/2017 | Zeller | G01R 33/50 |
| 2017/0315202 A1* | 11/2017 | Bhat | G01R 33/5617 |

OTHER PUBLICATIONS

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

Setsompop et al., "Improving diffusion MRI using simultaneous multi-slice echo planar imaging," NeuroImage vol. 63 569-580; (2012).

* cited by examiner

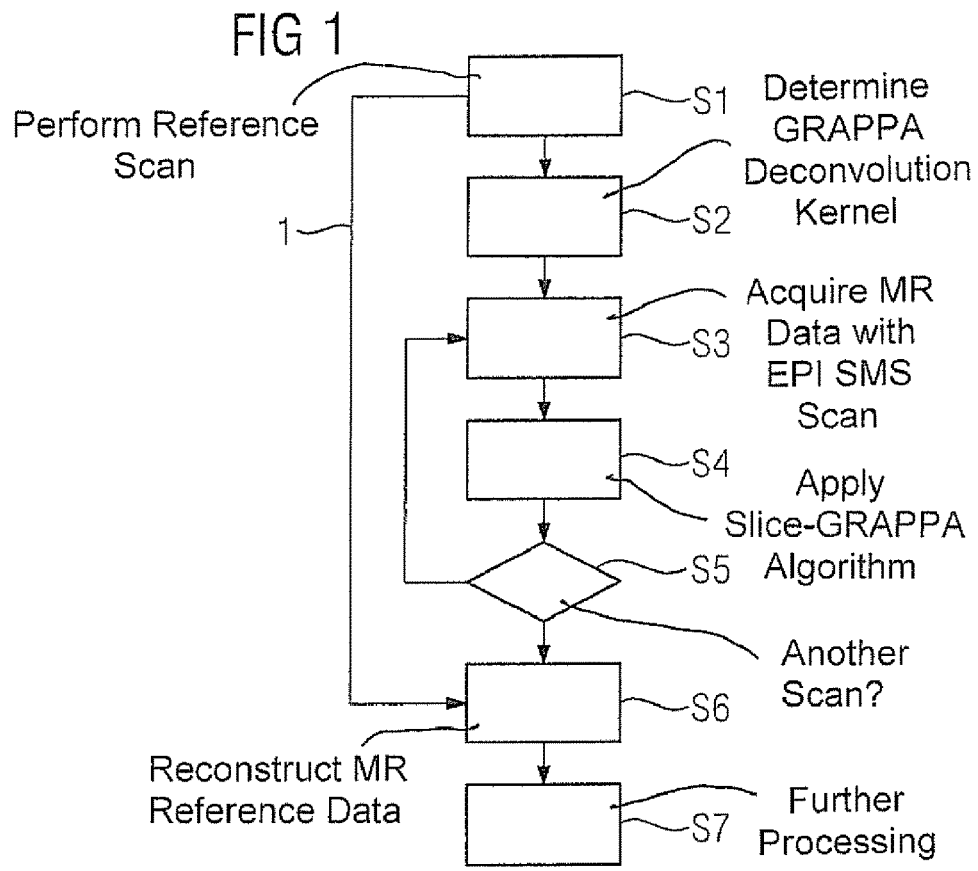
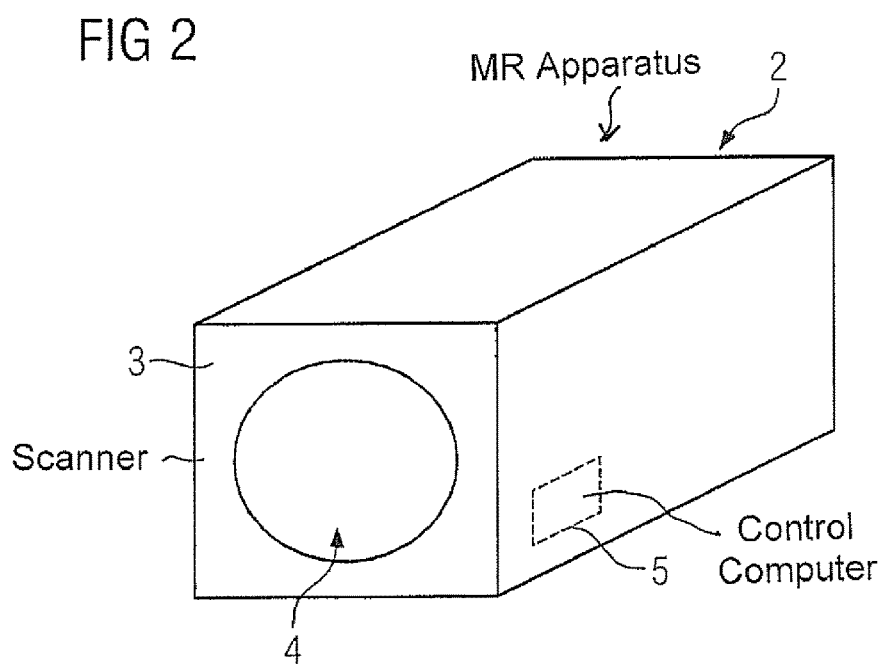

METHOD AND APPARATUS FOR GENERATING A MAGNETIC RESONANCE IMAGE DATA SET

BACKGROUND OF THE INVENTION

Field of the Invention

The invention concerns a method for generating a magnetic resonance image data set of a target region using a magnetic resonance scanner of the type wherein magnetic resonance data for a number of slices are recorded simultaneously with the recording of magnetic resonance data for the same or fewer number of different slices, wherein magnetic resonance data are assigned to respective individual slices in the multi-slice data set by separation algorithm of the type used in parallel imaging. This separation algorithm uses input parameters determined from a calibration data set of the target region, which was recorded in a reference scan. The magnetic resonance image data set is thereafter reconstructed from the magnetic resonance data assigned to individual slices. The invention further concerns a magnetic resonance apparatus, and a non-transitory electronically readable data storage medium for implementing such a method.

Description of the Prior Art

A problem associated with magnetic resonance (MR) imaging, particularly in the field of medicine when therefore target regions of a patient must be examined, is the duration required for the acquisition of the magnetic resonance data from the subject. In order to accelerate this, a technique known as parallel imaging has been developed, in which the MR data are acquired with multiple receiving coils in multiple receiving channels. As part of the process of parallel imaging, it is possible e.g. to excite a number of slices in a stack of slices and to record multi-slice data from all of these slices simultaneously, such that a multi-slice data set in k-space is composed of the simultaneously recorded slices superimposed one upon the other. In order to separate these slices, and therefore to extract magnetic resonance data relating to individually recorded slices from the multi-slice data set, separation algorithms can be used that were developed for parallel imaging, e.g. the so-called slice-GRAPPA algorithm. This approach can also be combined with other parallel imaging techniques, e.g. the standard GRAPPA or SENSE. Further details about simultaneous multi-slice imaging (SMS imaging) can be found in the article by Setsompop et. al. "Blipped-Controlled Aliasing in Parallel Imaging for Simultaneous Multislice Echo Planar Imaging with Reduced g-Factor Penalty", Magnetic Resonance in Medicine 67:1210-1224 (2012). The application of SMS imaging to diffusion recordings is described in the article by Setsompop et. al., "Improving diffusion MRI using simultaneous multi-slice echo planar imaging", NeuroImage 63:569-580 (2012). Both articles also explain the slice-GRAPPA algorithm in detail.

When using the slice-GRAPPA algorithm as a separation algorithm, a GRAPPA-type deconvolution kernel, which is derived from a calibration data set obtained in a reference scan, is used for the slices, such that when applied to the superimposed multi-slice data, k-space points that belong to each individual imaging slice can be determined. If a threefold acceleration is required with respect to the slices, and therefore a second number of three slices in each case are recorded simultaneously in a multi-slice scan, three separate sets of GRAPPA kernels are determined and applied. It is again noted in this case that SMS imaging, i.e. acceleration by recording multiple slices in parallel, can obviously also be enhanced by further acceleration measures, in particular by in-plane acceleration measures, and therefore conventional GRAPPA can also be applied after the slice-GRAPPA algorithm, in order to determine missing k-space lines for those slices with in-plane undersampling.

In the case of the cited diffusion imaging and in a multiplicity of further imaging situations, magnetic resonance data are recorded more than once, and then averaged afterwards. In the example of diffusion imaging, e.g. various b-value scans are performed, wherein magnetic resonance data is usually recorded multiple times in order to reduce the image noise and to increase the reliability of the ADC map calculation. In this context, it may occur in isolated cases that b=0 magnetic resonance image data sets, whose magnetic resonance data were recorded using SMS imaging with coils having a small number of channels, exhibit slice crosstalk artifacts, which can appear, for example, as fat halo signs due to insufficient slice separation.

SUMMARY OF THE INVENTION

An object of the invention is to provide a method for determining magnetic resonance image data sets in SMS imaging, with which image quality is improved and artifacts are reduced.

This object is achieved in a method of the type cited in the introduction but wherein, in accordance with the invention, at least part of the calibration data set also is used for the purpose of reconstructing the magnetic resonance image data set.

According to the invention, calibration data of the reference scan are incorporated in the final magnetic resonance image data set. This takes advantage of the fact that in many application scenarios, the recording parameters for the reference scan correspond largely to those of the imaging (diagnostic) scan, particularly with respect to the spatial resolution and the echo time, and therefore in the context of the present invention, for the purpose of recording the calibration data set, at least some of the same recording parameters are used, in particular at least those relating to the slice definition and/or the spatial resolution and/or the contrast and/or the echo time, as are used for the purpose of recording the diagnostic magnetic resonance data. Therefore the calibration data of the reference scan can be treated in exactly the same way as the slice-accelerated magnetic resonance data, after this has been distributed among the various slices by the separation algorithm. The calibration data therefore can be added to the magnetic resonance data after the application of the separation algorithm, for example, in order to use the calibration data in a coordinated manner for the purpose of reconstructing the magnetic resonance image data set.

It is thereby possible to achieve an increase in the image quality, in particular by increasing the signal-to-noise ratio, firstly by using additional data and secondly by virtue of the fact that no slice acceleration occurs here. It is also possible, as previously shown, to achieve a further significant reduction in slice crosstalk artifacts.

The calibration data can be utilized in various ways as part of the reconstruction procedure, for example, in the case of static determination of the magnetic resonance image data, by being involved in of averaging as an equally weighted further basic data set to be averaged. Other reconstruction methods may involve a weighted incorporation of at least part of the calibration data and/or use the calibration data to check the plausibility of structures. In this case, a particularly suitable field of application is MR data recording procedures in which the slices of the target region of the patient are recorded multiple times, since the reference scan in this context is often not performed with limited resolution or limited echo time, and therefore the calibration data and the magnetic resonance data are ultimately comparable. In such a context, there is also an opportunity to reduce the recording time, since a pass for recording magnetic resonance data of the slices can be omitted as a result of using the calibration data set, for example.

A slice-GRAPPA algorithm as described in the articles by Setsompop cited above is preferably used as such a separation algorithm. The recording of the magnetic resonance data and/or the calibration data can be appropriately done by an EPI sequence (echo planar imaging) or using a TSE sequence (turbo-spin-echo), a GRE sequence (gradient-echo) or an SE sequence (spin-echo).

As mentioned above and explained in greater detail below, the method is particularly suitable for application in SMS EPI diffusion measurements. The method is not limited to this type of measurement, however, and can also be used advantageously in other application scenarios. One such example is SMS TSE measurements, which likewise often involve repeated recording of the slices, in particular likewise for the purpose of recording different k-space regions/lines. Here the different recordings supplement each other to provide greater coverage of k-space. K-space thus can be progressively filled, for example. Further such examples where the method can be usefully applied include SMS GRE, i.e. gradient-echo imaging, and SMS SE, i.e. normal spin-echo imaging.

In the last cited context specifically, with regard to recording of the calibration data and the magnetic resonance data using a TSE sequence in which a recording is at least partially undersampled, an embodiment of the present invention provides for at least part of the calibration data to be incorporated in the reconstruction as a supplement in relation to portions of k-space that were not sampled by the magnetic resonance data. In this context, it is also possible to incorporate only part of the calibration data in the reconstruction, if a supplement is required only in specific regions. If only specific k-space lines were recorded in the reference scan, such calibration data are nonetheless useful for improving the final reconstruction. In a specific application scenario, it may be intended that k-space center is fully sampled and recorded for all slices as part of the reference scan, while the other parts of k-space are recorded as (filled with) magnetic resonance data in subsequent recording operations. The corresponding k-space data of the reference scan, which were recorded as part of the SMS TSE scan, thus can feed in to the reconstruction process and supplement k-space coverage. This also applies to SMS GRE and SMS SE.

As explained above, diffusion imaging is a particularly advantageous application field of the invention, and therefore in another embodiment of the inventive method, a diffusion image data set is determined as a magnetic resonance image data set, wherein the target region is recorded multiple times, and a statistical combination (in particular averaging) of the magnetic resonance data from the various recording operations of the target region, including the recording operation of the calibration data set, is performed. In the case of diffusion imaging (cf. also the article by Setsompop in NeuroImage cited above), calibration data are usually recorded in the reference scan for b=0 under the same imaging conditions, and therefore using the same recording parameters, but for all slices individually. Further b=0 recording operations are then effected by SMS imaging, e.g. accelerated by a factor of three, such that inclusion of the b=0-calibration data makes it possible to improve the signal-to-noise ratio without the image resolution or diagnostic quality being compromised. Finally, this also applies to ADC data which are determined using the b=0 magnetic resonance image data set. (In this description, b designates the known b-value, which combines the gradient terms as a function of the recording parameters. ADC refers to the "apparent diffusion coefficient", which is intended to signify that the diffusion process in tissues is not free, but is disrupted and modulated by various mechanisms, and that other effects are also incorporated in the signal attenuation and/or image values.)

For effective use of the calibration data set, it is also appropriate, when using at least one preparation pulse for recording the magnetic resonance data, for the at least one preparation pulse to also be used before the recording of the calibration data set. In this way, the comparability of the calibration data with the magnetic resonance data is ensured beyond the actual recording parameters.

As mentioned above, the calibration data set can also be undersampled when it is recorded. It is also conceivable for the calibration data set to be recorded with limited spatial resolution. Even if the calibration data depicts only specific k-space lines and/or were recorded in low resolution, such calibration data can still be used to improve the final reconstruction.

In addition to the method, the invention also concerns a magnetic resonance apparatus having a control computer that is designed to operate the scanner of the apparatus in order to perform the inventive method. All of the explanations relating to the inventive method are similarly applicable to the inventive magnetic resonance apparatus, including the previously cited advantages. In addition to a recording processor that controls the recording of magnetic resonance data and calibration data by the scanner, the control computer can have a separation processor that applies the separation algorithm, and a reconstruction processor that reconstructs the magnetic resonance image data set. The reconstruction processor is designed as to additionally use at least part of the reference data set during the reconstruction of the magnetic resonance image data set.

The present invention also encompasses a non-transitory, computer-readable data storage medium encoded with programming instructions that, when the storage medium is loaded into a computer system of a magnetic resonance apparatus, cause the computer system to operate the magnetic resonance apparatus in order to implement any or all of the embodiments of the method according to the invention described above. The storage medium can be a CD-ROM, for example.

BRIEF DESCRIPTION OF THE DRAWINGS

FIG. 1 is a flowchart of the method according to the invention.

FIG. 2 shows a magnetic resonance device according to the invention.

DESCRIPTION OF THE PREFERRED EMBODIMENTS

FIG. 1 is a flowchart of an exemplary embodiment of the method according to the invention. In this case, it is intended to use diffusion imaging for the brain of a patient as a target region. Generally speaking, in the case of such diffusion imaging, MR data are acquired from respective slices of a stack of slices repeatedly for various b-values, including b=0. In order to generate magnetic resonance image data sets, the magnetic resonance data recorded thus for various b-values can be statistically combined, in particular averaged. On the basis of the magnetic resonance image data sets thus determined, it is possible to specify an ADC map, for example.

As a result of the repeated recording operations of the target region, the measurement takes a relatively long time, and therefore in the exemplary embodiment of the inventive method illustrated here, an acceleration in the data acquisition is achieved by parallel imaging, whereby multiple slices of the stack of slices are recorded simultaneously to form a multi-slice data set, e.g. two or three slices. SMS imaging is therefore used, and EPI sequences are also used in this case. In order to allow the magnetic resonance data for the individual slices to be derived from the multi-slice data set, a slice-GRAPPA algorithm is used, which is based on deconvolution kernels determined in a reference scan (calibration scan).

In step S1 of the method, the reference scan is performed, during which each slice is measured using recording parameters that will also be used subsequently for the multi-slice data sets, in order to obtain a calibration data set. This is usually performed for b=0, after which the deconvolution kernels of the slice-GRAPPA algorithm, as determined subsequently in a step S2, can also be used for other values of the b-factor. The recording parameters for recording the calibration data in this case correspond, at least in respect of the slice definition, spatial resolution, contrast and echo time, to the recording parameters used subsequently for recording the magnetic resonance data in the SMS EPI method. If it is intended to use preparation pulses, these are also included in the reference scan.

The calibration data set, however is not discarded after the deconvolution kernels have been determined in the step S2, but is instead saved in a memory of the control computer of the magnetic resonance apparatus.

The recording of magnetic resonance data (diagnostic data) then starts in step S3, wherein SMS EPI scans are performed in order to obtain multi-slice data sets as mentioned above. As part of this procedure, a number of slices are excited simultaneously and then measured, a "blipped CAIPIRINHA" method being applied during the echo train in order to minimize the signal-to-noise ratio loss in relation to the geometry factor (g-factor). In step S4, the slice-GRAPPA algorithm is then applied in order to assign the magnetic resonance data to the individual slices which were excited for the multi-slice scan.

It can be appropriate to use further acceleration options, e.g. in-plane acceleration by means of omitting individual k-space lines, etc. In such a case, the missing k-space lines can be determined in a further process step by the known conventional in-plane GRAPPA algorithm.

In step S5, a check is made as to whether further recording operations are pending and, if so, they are performed accordingly.

Following completion of all recording operations (or at least all recording operations relating to a specific b-factor), the reconstruction of the corresponding magnetic reference data set takes place in step S6, wherein the calibration data set is also used as indicated by the arrow 1. This means that at least some calibration data are also incorporated into the reconstruction of the resulting magnetic resonance image data set. In this case, the calibration data set from step S1 (as recorded in the reference scan) is incorporated, with at least equal weighting, into the averaging for a b=0 magnetic resonance image data set. It would also be possible to give the calibration data set a slightly higher weighting on the basis of the particular quality resulting from an absence of slice acceleration. It should be noted that exemplary embodiments are also conceivable in which, on the basis of knowledge of the excellent reusability of the calibration data set, a recording operation for b=0 magnetic resonance data is omitted in order to further shorten the measuring time to that extent. An improvement in the signal-to-noise ratio or the image quality in general is nonetheless present in the field of diffusion imaging, since the recording parameters of the reference scan correspond to those of the multi-layer scan, but no slice acceleration is present.

Further processing steps can then take place in step S7, e.g. track-weighted images, ADC maps, etc. can be determined.

Other embodiments of the inventive method can also be used apart from diffusion imaging, e.g. for SMS TSE imaging, wherein e.g. k-space portions of the calibration data set can be used as a supplement. Further useful fields of application include SMS GRE and SMS SE. In general, it should be noted that even undersampling during the recording of the calibration data set or limited spatial resolution during the recording of the calibration data set does not prevent the application of the described method, and even such calibration data, when taken into consideration during the reconstruction, can contribute to an improvement of the magnetic resonance image data set that is ultimately produced.

FIG. 2 lastly shows a block diagram of a magnetic resonance apparatus 2 according to the invention that has an MR data acquisition scanner 3 with a patient receptacle 4 defined therein, into which a patient can be introduced by a patient couch (not shown) for the purpose of recording magnetic resonance data. The operation of the magnetic resonance scanner 3 is controlled by a control computer 5. For this purpose, the control computer 5 has a recording processor that controls the recording operation, a separation processor for assigning magnetic resonance data to slices during the SMS imaging, and a reconstruction processor designed as to use at least part of the calibration data for the reconstruction of magnetic resonance image data sets, as described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image data set of a target region, comprising:

operating an MR data acquisition scanner to acquire MR data from a first number of slices of the target region while simultaneously acquiring MR data from a second number of slices of the target region that are different from said first number of slices, said second number being less than or equal to said first number, and thereby obtaining a multi-slice data set from said target region;

providing a computer with said multi-slice data set and providing said computer with a calibration data set of the target region obtained in a reference scan of the target region;

in said computer, executing a parallel imaging separation algorithm in order to determine magnetic resonance data individually for the respective slices represented in said multi-slice data set and, in said separation algorithm, using input parameters determined in said computer from said calibration data set;

in said computer, reconstructing an MR image data set from the individual magnetic resonance data respectively for said slices by executing a reconstruction algorithm in said computer using at least a part of said calibration data set for reconstructing said MR image data set; and making the MR image data set available from said computer in electronic form as a data file.

2. A method as claimed in claim 1 comprising using recording parameters when operating said MR data acquisition scanner to acquire said multi-slice data set, and generating said calibration data set, which is provided to the computer, by operating said MR data acquisition scanner to execute said reference scan using at least some of the same recording parameters used to acquire said multi-slice data set.

3. A method as claimed in claim 2 comprising selecting said at least some of the same recording parameters from the group consisting of a slice definition, a spatial resolution, a contrast, and an echo time.

4. A method as claimed in claim 2 comprising operating said MR data acquisition scanner to acquire at least one of said multi-slice data set and said calibration data set using an MR data acquisition sequence selected from the group consisting of an EPI sequence, a TSE sequence, a GRE sequence, and an SE sequence.

5. A method as claimed in claim 1 comprising using a slice GRAPPA algorithm as said separation algorithm.

6. A method as claimed in claim 1 wherein operating said MR data acquisition scanner to acquire said multi-slice data set includes entering said multi-slice data set into a memory organized as k-space, and operating said MR data acquisition unit to acquire said multi-slice data set using an MR data acquisition sequence that undersamples k-space, thereby resulting in portions of k-space that are not filled with data from said multi-slice data set, and using said calibration data set in said reconstruction algorithm to supplement k-space by filling said portions of k-space with data from said calibration data set.

7. A method as claimed in claim 1 comprising operating said MR data acquisition scanner according to a diffusion data acquisition sequence so that said multi-slice data set comprises diffusion data, and acquiring said diffusion data from said target region multiple times, thereby obtaining a plurality of multi-slice data sets comprising diffusion data and, in said computer, statistically combining said plurality of multi-slice data sets and said calibration data set.

8. A method as claimed in claim 7 comprising statistically combining said plurality of multi-slice data sets and said calibration data set by averaging.

9. A method as claimed in claim 1 comprising generating said calibration data set by operating said MR data acquisition scanner to execute said reference scan, and operating said MR data acquisition scanner to acquire said multi-slice data set using an MR data acquisition sequence that comprises at least one preparation pulse and also using said at least one preparation pulse before operating said MR data acquisition scanner to execute said reference scan.

10. A method as claimed in claim 1 comprising providing said computer with said calibration data set as an undersampled data set.

11. A magnetic resonance (MR) apparatus comprising:
an MR data acquisition scanner;
a computer configured to operate said MR data acquisition scanner to acquire MR data from a first number of slices of the target region while simultaneously acquiring MR data from a second number of slices of the target region that are different from said first number of slices, said second number being less than or equal to said first number, and thereby obtaining a multi-slice data set from said target region;
said computer being provided with a calibration data set of the target region obtained in a reference scan of the target region;
said computer being configured to execute a parallel imaging separation algorithm in order to determine magnetic resonance data individually for the respective slices represented in said multi-slice data set and, in said separation algorithm, using input parameters determined in said computer from said calibration data set;
said computer being configured to reconstruct an MR image data set from the individual magnetic resonance data respectively for said slices by executing a reconstruction algorithm in said computer using at least a part of said calibration data set for reconstructing said MR image data set; and
said computer being configured to make the MR image data set available from said computer in electronic form as a data file.

12. A non-transitory, computer-readable data storage medium encoded with programming instructions, said storage medium being loaded into a computer system of a magnetic resonance (MR) apparatus that comprises an MR data acquisition scanner, said programming instructions causing said computer system:
operate said MR data acquisition scanner to acquire MR data from a first number of slices of the target region while simultaneously acquiring MR data from a second number of slices of the target region that are different from said first number of slices, said second number being less than or equal to said first number, and thereby obtaining a multi-slice data set from said target region;
receive a calibration data set of the target region obtained in a reference scan of the target region;
execute a parallel imaging separation algorithm in order to determine magnetic resonance data individually for the respective slices represented in said multi-slice data set and, in said separation algorithm, using input parameters determined in said computer from said calibration data set;
reconstruct an MR image data set from the individual magnetic resonance data respectively for said slices by executing a reconstruction algorithm in said computer using at least a part of said calibration data set for reconstructing said MR image data set; and
make the MR image data set available from said computer system in electronic form as a data file.

* * * * *